(12) United States Patent
Brandenberger et al.

(10) Patent No.: US 7,038,941 B2
(45) Date of Patent: May 2, 2006

(54) MAGNETIC MEMORY STORAGE DEVICE

(75) Inventors: Sarah Morris Brandenberger, Boise, ID (US); Susan MF Davis, Nampa, ID (US); Jonathan Jedwab, London (GB); Colin Andrew Stobbs, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 228 days.

(21) Appl. No.: 10/741,581

(22) Filed: Dec. 19, 2003

(65) Prior Publication Data

US 2005/0135150 A1 Jun. 23, 2005

(51) Int. Cl.
*G11C 11/15* (2006.01)
(52) U.S. Cl. .................. 365/173; 365/158; 365/171
(58) Field of Classification Search ................ 365/173, 365/158, 171
See application file for complete search history.

(56) References Cited

U.S. PATENT DOCUMENTS

| | | | |
|---|---|---|---|
| 6,104,632 A | 8/2000 | Nishimura | |
| 6,169,688 B1 | 1/2001 | Noguchi | |
| 6,324,093 B1 | 11/2001 | Perner et al. | |
| 6,421,270 B1 | 7/2002 | Tai | |
| 6,477,077 B1 | 11/2002 | Okazawa | |
| 6,483,734 B1 | 11/2002 | Sharma et al. | |
| 6,501,697 B1 | 12/2002 | Perner et al. | |
| 6,512,690 B1 | 1/2003 | Qi et al. | |
| 2004/0105304 A1* | 6/2004 | Hidaka | 365/158 |
| 2004/0165419 A1* | 8/2004 | Tsuji | 365/158 |
| 2004/0233710 A1* | 11/2004 | Perner et al. | 365/171 |

* cited by examiner

*Primary Examiner*—Richard Elms
*Assistant Examiner*—N Nguyen

(57) ABSTRACT

A storage device including a magnetic memory and a control circuit. The control circuit is configured to transfer selected data from the magnetic memory a selected number of times and to regulate the transfer of the selected data from the magnetic memory subsequent to transferring the selected data from the magnetic memory the selected number of times.

28 Claims, 3 Drawing Sheets

MAGNETIC MEMORY STORAGE DEVICE

BACKGROUND OF THE INVENTION

Non-volatile storage devices are used to store a variety of types of material. For example, CD's and DVD's store material such as movies, music, books and software programs. In these applications, the CD's and DVD's are typically programmed at a manufacturing facility and distributed to intermediaries for distribution to consumers. The intermediaries, such as retail stores and video rental stores, sell and/or rent the programmed devices to the consumer for home use.

Consumers forego the cost of buying a CD or DVD by renting it from a rental store at a lower fee. In rental situations, the burden is placed on the consumer to go to the rental store to pick up the device, which must be done during the store's regular business hours. Also, the consumer must return the rented device to the rental store within a set number of days to avoid paying a late fee.

The intermediaries and producers of the material stored on the CD's and DVD's maintain control over distribution of the material by charging a late fee. The late fee can be as much or more than the cost of buying the programmed device. By maintaining some control over distribution, the intermediaries and producers are ensured of receiving their share of the money for use of the material.

Readers and players for CD's and DVD's include a motor and mechanisms for loading and unloading the storage device. The motor spins the device at a high rate of speed for reading the device. The motor and mechanisms include moving parts, which can lead to reliability problems. In addition, the motor and mechanisms add bulk to the readers and players and have power requirements, which limit the suitability of CD's and DVD's for portable applications. Also, the size of the CD's and DVD's can make transporting a number of these devices cumbersome.

SUMMARY OF THE INVENTION

Embodiments of the present invention provide a storage device. In one embodiment, the storage device comprises a magnetic memory and a control circuit. The control circuit is configured to transfer selected data from the magnetic memory a selected number of times and to regulate the transfer of the selected data from the magnetic memory subsequent to transferring the selected data from the magnetic memory the selected number of times.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
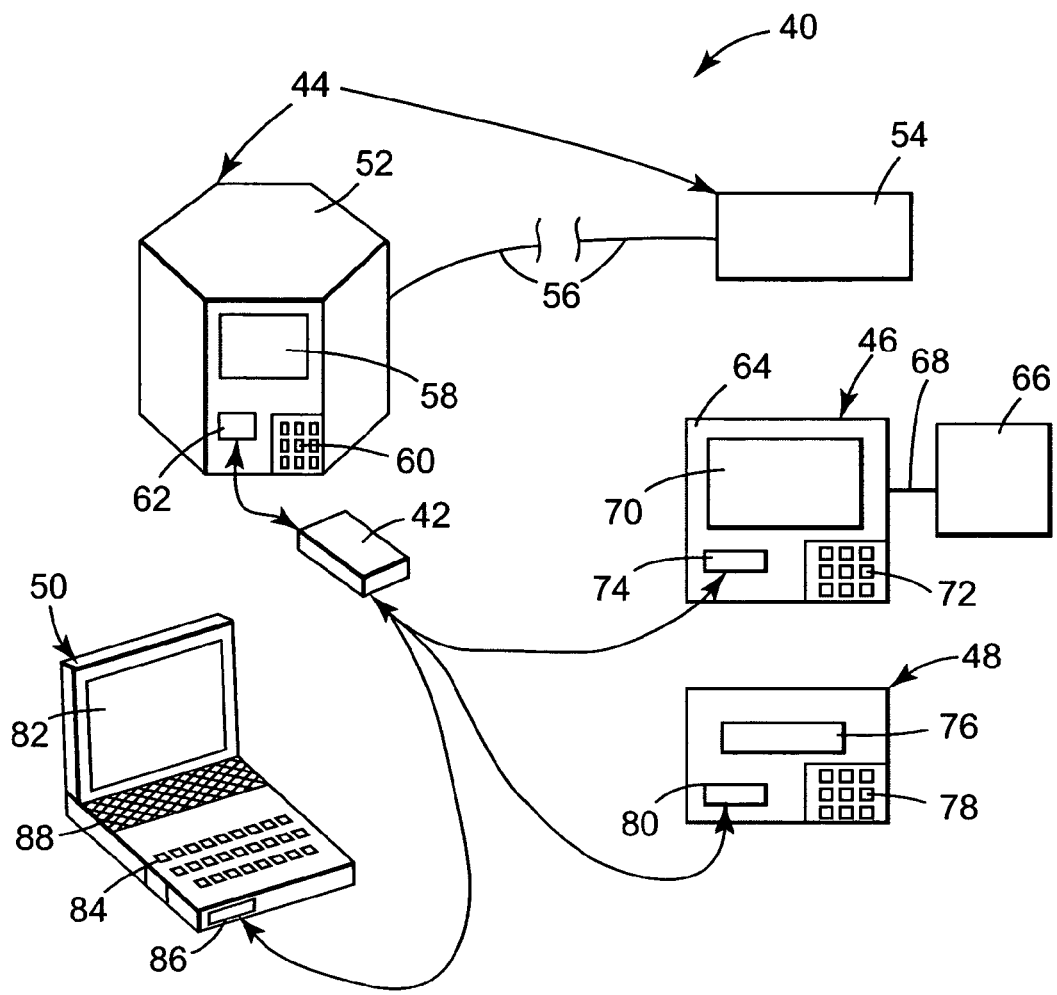
FIG. 1 is a diagram illustrating an exemplary media distribution system utilizing a storage device, according to an embodiment of the present invention.

FIG. 1 is a diagram illustrating a media distribution system 40 utilizing a storage device 42, according to an embodiment of the present invention. The distribution system 40 includes the storage device 42, a programming center 44, a video player 46, an audio player 48 and a computer 50. Only a small number of exemplary components of the distribution system 40 are shown to simplify the illustration. In practice, any number of suitable components can be used.

The programming center 44 downloads digital material to the storage device 42. The downloaded data may be any material including movies, music, books and software programs. By way of example, the downloaded data may be a software program in which the digital material is a test for distribution to students. The storage device 42 stores the data in a magnetic memory, such as a magnetic random access memory (MRAM), and is configured to transfer the data from the storage device 42 a selected number of times, such as at least one time. The storage device 42 regulates subsequent transfers of the data from the storage device 42. In one configuration, the storage device 42 prevents a second transfer of any data from the storage device 42. Regulating the transfer of data maintains control over distribution of the digital material.

In one embodiment, the storage device 42 is a compact, card-shaped unit including a high density, low power MRAM. The MRAM stores the digital material for reading and playback. A control circuit coupled to the MRAM regulates the transfer of data from the MRAM and storage device 42 to the readers and players, such as video player 46, audio player 48 and computer 50. The readers and players 46, 48 and 50 include communication interfaces for reading the storage device 42, but they do not contain loading mechanisms or motors. In one configuration, the readers and players 46, 48 and 50 can be compact devices with low power consumption. The compact size and low power consumption of storage device 42 and readers and players 46, 48 and 50 makes the storage device 42 suitable for portable applications.

The programming center 44 includes a programming station 52 and a central database 54. The programming station 52 is electrically coupled to the central database 54 through external bus 56. The central database 54 contains the digital material and account information on consumers who use the media distribution system 40. The programming station 52 downloads the digital material from the central database 54 to store the material in storage device 42. In practice, the media distribution system 40 has many stations, such as programming station 52, which are in communication with the central database 54. In other embodiments, the programming station 44 can be in communication with local databases of any suitable size and number.

The programming station 44 includes a display 58, a keypad 60 and a card slot 62. The consumer uses the display 58 and keypad 60 to select digital material for downloading to the storage device 42. The consumer operates the keypad 60 to scroll through menus and lists displayed on the display 58. The card slot 62 is configured to accept the storage device 42 for downloading.

In operation, the consumer begins a session with the programming station 52 by entering an access code. The access code is attached to an account number and the consumer's account information, which is stored in the central database 54. The programming station 52 verifies the consumer's account is current and proceeds to display the next screen on display 58 for selecting material to download to a storage device 42. In the event the consumer's account is not up to date, the transaction ends without downloading material. With a current account, the consumer selects material for downloading, the storage device 42 is slid into card slot 62 and the selected material is downloaded to the storage device 42. This process continues until the consumer has completed selecting and downloading material.

A variety of readers and players, including video player 46, audio player 48 and computer 50, can read the storage device 42. Video player 46 represents any type and size of video player including home theater and portable applications. Video player 46 includes a playback section 64 and an audio section 66. The playback section 64 and audio section 66 are electrically coupled through an audio communications bus 68. The audio section 66 is configured to receive digital and/or analog audio signals for playback.

The playback section 64 includes a display 70, a keypad 72 and a card slot 74. The display 70 is electrically coupled to processing circuitry to display menus for selecting material for playback and to display images during playback. The keypad 72 is electrically coupled to processing circuitry to select menu items and material for playback. The card slot 74 is configured to receive the storage device 42.

In operation, the consumer begins a session with the video player 46 by inserting the storage device 42 into the card slot 74. From an initial menu, the consumer selects a listing of material stored on the storage device 42. Using the keypad 72, the consumer scrolls through the listing and selects material for playback on the video player 46. The consumer instructs the video player 46 to begin reading the storage device 42 and playing back the selected material. The video player 46 displays video images on the display 70 and produces sound through the audio section 66. After the selected material has been read from the storage device 42, the video player 46 displays a default menu or image on the display 70.

Audio player 48 represents any type and size of audio player including digital surround sound systems, stereo systems and portable players. Audio player 48 includes a display 76, a keypad 78 and a card slot 80. The display 76 is electrically coupled to processing circuitry to display menus and lists of material stored on storage device 42. The keypad 78 is electrically coupled to processing circuitry for scrolling through the menus and lists to select material for playback on the audio player 48. The card slot 80 is configured to receive the storage device 42.

In operation, the consumer begins a session with the audio player 48 by inserting the storage device 42 into the card slot 80. Using the keypad 78, the consumer directs the audio player 48 to display a listing of the material stored on the storage device 42. Next, the consumer selects material stored on the storage device 42 for playback. In the alternative, the consumer can direct the audio player 48 to play all listed material stored in the storage device 42. After the audio player 48 has completed reading the material from the storage device 42, the consumer can remove the storage device 42 from the card slot 80.

The computer 50 is a portable computer and represents any type and size of computer. Computer 50 includes a display 82, a keypad 84, a card slot 86 and speakers 88. The display 82 is electrically coupled to processing circuitry to display menus and lists of material stored on the storage device 42, and to display images played back from the storage device 42. The keypad can be used to select material from the storage device 42, and the speakers 88 are electrically coupled to audio amplifier circuitry to play sounds read from the storage device 42. The card slot 86 is configured to receive the storage device 42.

In operation, the consumer begins a session with the computer 50 and inserts the storage device 42 into the card slot 86. The storage device 42 is read by the computer 50 and a listing of the material stored on the storage device 42 is displayed. The consumer uses the keypad 84 and the display 82 to select material to be read from the storage device 42. The computer 50 reads the material and the storage device 42 is removed.

The storage device 42 is configured to transfer data a selected number of times, such as one time. The storage device 42 regulates the transfer of the data from the storage device 42 subsequent to transferring the data the selected number of times. Regulation, as used herein, is a range of regulation from permitting the transfer of a portion of the data subsequent to transferring the data the selected number of times, such as permitting a fixed percentage of the selected data to be transferred, to preventing the transfer of any data subsequent to transferring the data the selected number of times. In one exemplary embodiment, the storage device 42 is configured to non-destructively prevent the transfer of data from the MRAM and storage device 42 subsequent to transferring the data the selected number of times. In this embodiment, the storage device 42 is reusable and can be reprogrammed by the programming center 44. In another exemplary embodiment, storage device 42 destructively prevents the transfer of data from the MRAM and storage device 42 subsequent to transferring the data the selected number of times. In this embodiment, the storage device 42 may include a fuse and a fuse programming circuit electrically coupled to a controller. The controller directs the fuse programming circuit to program or burn the fuse to prevent or disable the transfer of data.

Figure 2:
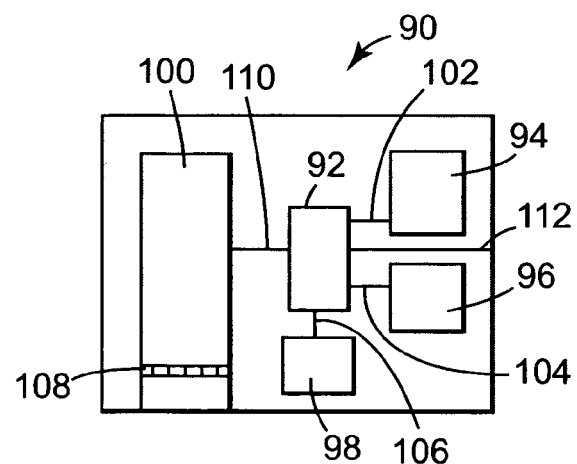
FIG. 2 is a block diagram illustrating an exemplary embodiment of a read/write circuit configured to communicate with the storage device.

FIG. 2 is a block diagram illustrating an exemplary embodiment of a read/write circuit 90 configured to communicate with storage device 42. The read/write circuit 90 is configured for use in programming center 44, video player 46, audio player 48 and computer 50. The read/write circuit 90 includes a central processing unit (CPU) 92, a display 94, a keypad 96, local memory 98 and a storage device communications interface 100. The display 94, keypad 96 and communications interface 100 correspond to similar elements found on the programming center 44, video player 46, audio player 48 and computer 50.

The CPU 92 is electrically coupled to display 94 through display bus 102, and to keypad 96 through keypad bus 104. In addition, the CPU 92 is electrically coupled to local memory 98 through memory bus 106, and to external bus 112. The communications interface 100 includes electrical contacts 108 electrically coupled through the communications interface 100 and interface bus 110 to CPU 92. The electrical contacts 108 are configured to interface with corresponding electrical contacts on storage device 42. In the exemplary embodiment, the CPU 92 is a microprocessor. In another embodiment, the CPU 92 can be a controller and electrical contacts 108 can be replaced with a radio frequency (RF) interface, infrared (IR) interface or another suitable interface.

The CPU 92 is programmed to selectively perform the functions of the programming center 44, video player 46, audio player 48 or computer 50. The program for the CPU 92 is stored in CPU 92 and local memory 98. The local memory 98 includes non-volatile memory, such as ROM, EPROM and EEPROM, and volatile memory, such as RAM. The CPU 92 reads code from local memory 98 to perform functions, such as displaying menus on display 94, receiving inputs from keypad 96, communicating with storage device 42 and communicating through external bus 112.

The CPU 92 in programming center 44 is programmed to interface with the consumer and download digital material to the storage device 42. The CPU 92 displays an initial menu on display 94 and reads inputs from keypad 96 to progress through menus for accessing and downloading digital material. The CPU 92 communicates with the central database 54 through external bus 112 to access account information, material lists and download selected material.

In operation, the consumer selects material for downloading through the menu structure and inserts storage device 42 into communications interface 100 to make electrical contact with contacts 108. The CPU 92 downloads the selected material from the central database 54 through external bus 112. In the exemplary embodiment, the CPU 92 downloads the selected material directly to the storage device 42 through communications bus 110, communications interface 100 and electrical contacts 108. In another embodiment, the CPU 92 downloads selected material to local memory 98 and then to storage device 42. After the selected material is downloaded, CPU 92 displays a message on display 94 to prompt the consumer that downloading is complete and storage device 42 can be removed.

In a video player 46, audio player 48 and computer 50, the read/write circuit 90 is configured to read storage device 42. The CPU 92 in video player 46 is programmed to interface with the consumer and read or playback digital material from storage device 42. The CPU 92 displays an initial menu on display 94 and reads inputs from keypad 96 to progress through menus for selecting digital material. The consumer selects material using the keypad 96 and playback commences. The CPU 92 communicates with the audio section 66 of video player 46 through external bus 112.

In operation, the consumer inserts storage device 42 into communications interface 100 to make electrical contact with contacts 108. Using the keypad 96 and display 94, the consumer scans the material stored in the storage device 42 and selects material for reading or playback. The CPU 92 communicates with the storage device 42 through communications interface 100 to read the selected material from storage device 42. CPU 92 processes data that is read from storage device 42 to display images on display 94 and produce sound through audio section 66. The CPU 92 displays a default menu or image on display 94 after the selection has been played back from storage device 42.

The CPU 92 in audio player 48 is programmed to interface with the consumer and read or playback digital material from storage device 42. The CPU 92 displays an initial menu on display 94 and reads inputs from keypad 96 to progress through menus for selecting digital material. The consumer selects material using the keypad 96 and playback commences. The CPU 92 provides audio data through external bus 112 to an audio amplifier circuit (not shown).

In operation, the consumer inserts storage device 42 into communications interface 100 to make electrical contact with contacts 108. CPU 92 reads storage device 42 and compiles a list of material stored on storage device 42. The list is displayed on display 94 and the consumer scrolls through the list using keypad 96 to select material for playback. After material is selected, CPU 92 reads the storage device 42 and communicates through external bus 112 to the audio amplifier circuit. Upon completing playback, CPU 92 displays a default menu or image on display 94.

The CPU 92 in computer 50 is programmed to interface with the consumer and read or playback digital material from storage device 42. The CPU 92 displays an initial menu on display 94 and reads inputs from keypad 96 to progress through menus and lists for selecting digital material. The consumer selects material using the keypad 96 and playback commences. The CPU 92 provides audio data through external bus 112 to an audio amplifier circuit (not shown) and speakers 88.

In operation, the consumer inserts storage device 42 into communications interface 100 to make electrical contact with contacts 108. The consumer selects an initial menu and CPU 92 displays the initial menu on display 94. From this menu, the consumer obtains a list of material stored on storage device 42 and selects material for use on computer 50. The CPU 92 reads the selected material from the storage device 42 and provides images and audio to display 94 and speakers 88. Upon completing playback, CPU 92 displays a default menu or image on display 94.

The read/write circuit 90 is an exemplary embodiment of a circuit, which can be used to write the storage device 42 or read the storage device 42. In another embodiment, the read/write circuit 90 can be configured to both read and write the storage device 42. In this situation, the video player 46, audio player 48 and computer 50 can be used to program storage device 42 as well as read storage device 42. The storage device 42 regulates the transfer of data from storage device 42.

Figure 3:
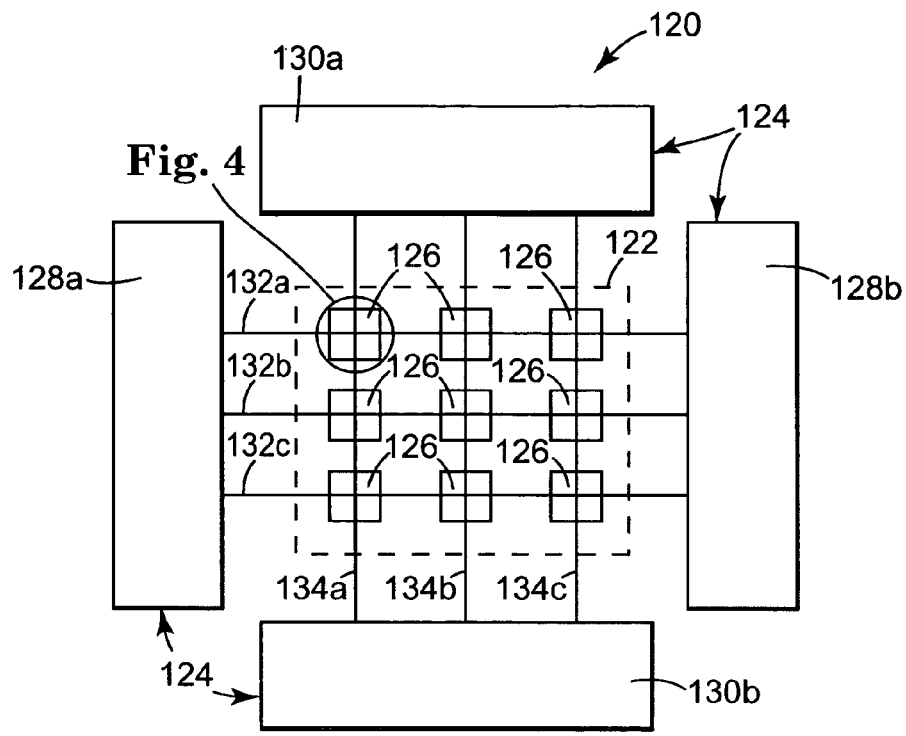
FIG. 3 is a block diagram illustrating an exemplary embodiment of an MRAM device used in the storage device.

FIG. 3 is a block diagram illustrating an exemplary embodiment of an MRAM device 120 used in storage device 42. The MRAM 120 includes a magnetic memory cell array 122 electrically coupled to a write circuit 124 and a read circuit (not shown for clarity). The memory cell array 122 includes magnetic memory cells, indicated at 126 and described herein.

The magnetic memory cells 126 can be of different types, for example, magnetic tunnel junction (MTJ) memory cells or giant magneto resistive (GMR) memory cells. In one configuration, magnetic memory cell 126 includes a layer of magnetic film in which the orientation of magnetization is alterable, and a layer of magnetic film in which the orientation of magnetization may be fixed or "pinned" in a particular direction. The magnetic film having alterable magnetization is referred to as a sense layer or data storage layer. The magnetic film that is fixed is referred to as a reference layer or pinned layer.

A memory cell 126 stores a bit of information as an orientation of magnetization in the sense layer. The orientation of magnetization in the sense layer aligns along an axis of the sense layer referred to as its easy axis. Magnetic fields are applied to flip the orientation of magnetization in the sense layer along its easy axis to either a parallel or anti-parallel orientation with respect to the orientation of magnetization in the reference layer. The resistance through the memory cell 126 differs according to the parallel or anti-parallel orientation of magnetization of the sense layer and the reference layer. This resistance is highest when the orientation is anti-parallel, and lowest when the orientation is parallel. The state of the memory cell 126 can be determined by sensing the resistance of the memory cell 126.

The memory cells 126 in array 122 are arranged in rows and columns, with the rows extending along an x-direction and the columns extending along a y-direction. Only a relatively small number of memory cells 126 are shown to simplify the illustration of the MRAM device 120. In practice, arrays of any suitable size can be used.

In the exemplary embodiment, the write circuit 124 includes row decoders 128a–128b and column decoders 130a–130b. Row decoders 128a–128b are electrically coupled to word lines 132a–132c, and column decoders 130a–130b are electrically coupled to bit lines 134a–134c. The conductive word lines 132a–132c extend along the x-direction in a plane on one side of the array 122, and the conductive bit lines 134a–134c extend along the y-direction in a plane on an opposing side of the array 122. There is one word line 132 for each row of the array 122, and one bit line 134 for each column of the array 122. A memory cell 126 is located at each cross point of a word line 132 and a bit line 134.

During a write operation, row decoders 128a–128b select one of the word lines 132a–132c and column decoders 130a–130b select one of the bit lines 134a–134c for writing the state of the memory cell 126 located at the selected word line 132a–132c and bit line 134a–134c cross point. Row decoders 128a–128b supply a write current through the selected word line 132a–132c to create a magnetic field in a selected memory cell 126. Row decoders 128 source the write current from row decoder 128a and sink the write current in row decoder 128b, or vice-versa. Column decoders 130a–130b supply a write current through the selected bit line 134a–134c to create a magnetic field in the selected memory cell 126. Column decoders 130 source the write current from column decoder 130a and sink the write current in column decoder 130b, or vice-versa. In other embodiments, the row decoders 128a–128b and column decoders 130a–130b can supply current in only one direction. In the exemplary embodiment, the write current supplied by the write circuit 124 create magnetic fields around the selected word line 132a–132c and bit line 134a–134c, according to the right hand rule. These magnetic fields combine to set or switch the orientation of magnetization in the selected memory cell 126.

In one embodiment, MRAM device 120 includes sense conductors, which extend along the x-direction in a plane on one side of the array 122. These sense conductors are electrically coupled to the read circuit for sensing the resistance of the memory cells 126. Bit lines 134a–134c, which extend along the y-direction on an opposing side of array 122, are also electrically coupled to the read circuit.

During a read operation, the read circuit selects one sense conductor and one bit line 134a–134c to sense the resistance of the memory cell 126 located at the cross point. Various methods can be used to sense the resistance. In the exemplary embodiment, a sense current is supplied through the sense conductor and memory cell 126 to the bit line 134a–134c to produce a voltage across the selected memory cell 126. This voltage is detected and used to determine the state of the memory cell 126. Circuits and methods for sensing the resistance and state of memory cells 126 are disclosed and described in U.S. Pat. No. 6,259,644, issued Jul. 10, 2001, entitled "Equi-potential Sense Methods for Resistive Cross Point Memory Cell Arrays", which is incorporated herein by reference.

Figure 4:
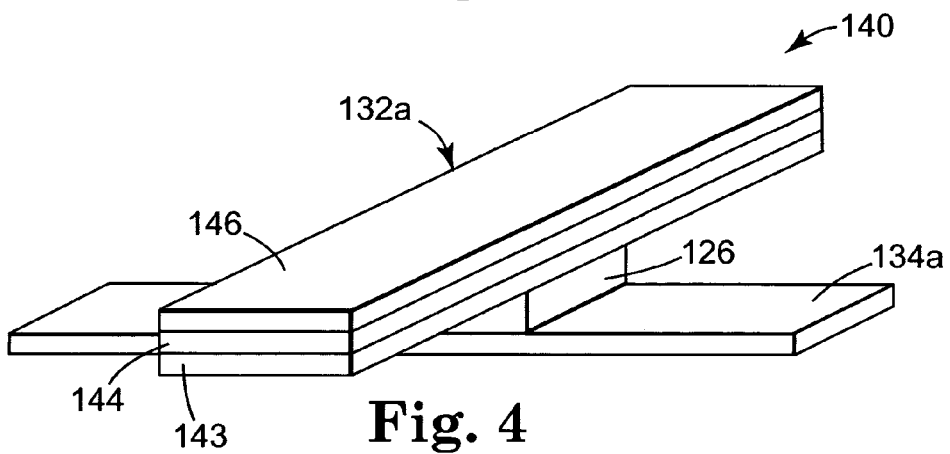
FIG. 4 is a diagram illustrating an exemplary embodiment of a magnetic memory cell array section.

FIG. 4 is a diagram illustrating an exemplary embodiment of an array section, indicated at 140. Array section 140 includes a magnetic memory cell 126 intersected by a word line 132a and a bit line 134a. The word line 132a includes a sense conductor 143, an isolation layer 144 and a write conductor 146. Memory cell 126 is located between bit line 134a and sense conductor 143. Isolation layer 144 is located between sense conductor 143 and write conductor 146.

In the exemplary embodiment, write conductor 146 and bit line 134a are electrically coupled to write circuit 124. Write currents passed through write conductor 146 and bit line 134a create magnetic fields, according to the right hand rule, in memory cell 126. Sense conductor 143 and bit line 134a are electrically coupled to the read circuit. A sense current supplied through sense conductor 143 and memory cell 126 to bit line 134a creates a voltage across memory cell 126. The voltage across memory cell 126 is detected over sense conductor 143 and bit line 134a. Isolation layer 144 isolates sense conductor 143 and memory cell 126 from write conductor 146 during read and write operations.

Figure 5:
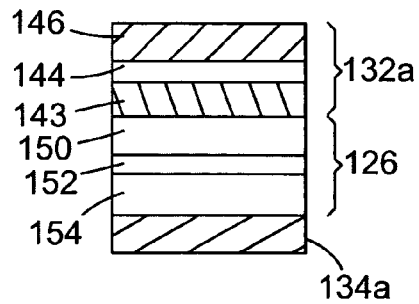
FIG. 5 is a diagram illustrating an exemplary embodiment of a magnetic memory cell intersected by a word line and a bit line.

FIG. 5 is a diagram illustrating an exemplary embodiment of memory cell 126 intersected by word line 132a and bit line 134a. Memory cell 126 includes a sense layer 150, a spacer layer 152 and a reference layer 154. The spacer layer 152 is located between the sense layer 150 and the reference layer 154. The sense layer 150 has an alterable magnetization state and the reference layer 154 has a pinned orientation of magnetization. The word line 132a includes the sense conductor 143, the isolation layer 144 and the write conductor 146. The isolation layer 144 is located between the sense conductor 143 and the write conductor 146. The sense conductor 143 is located next to the sense layer 150 of memory cell 126. The bit line 134a is located next to the reference layer 154 of the memory cell 126. In the exemplary embodiment, the memory cell is a spin-tunneling device where the spacer layer 152 is an insulating barrier layer through which an electrical charge migrates during read operations. Electrical charge migrations through the spacer layer 152 occur when a sense current is supplied through a memory cell 126. In an alternative embodiment, a GMR structure can be used for memory cell 126 and the spacer layer 152 is a conductor such as copper.

Figure 6:
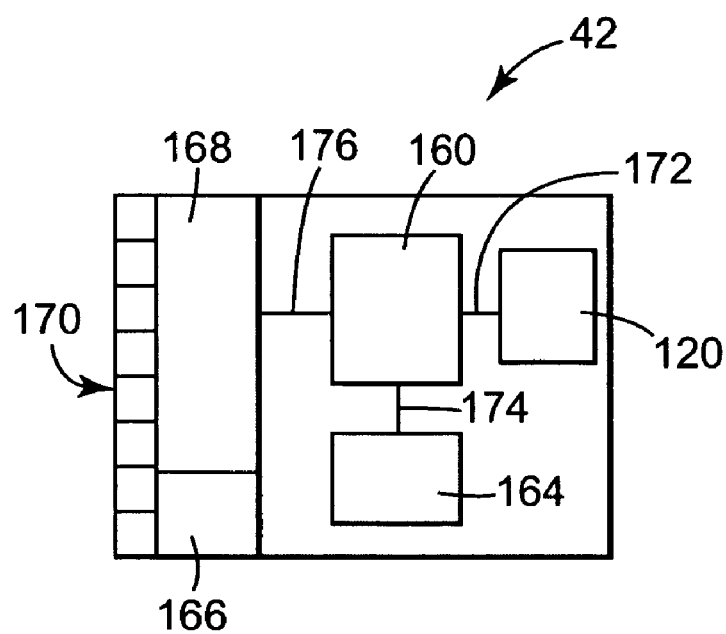
FIG. 6 is a diagram illustrating an exemplary storage device, according to an embodiment of the present invention.

FIG. 6 is a diagram illustrating an exemplary storage device 42, according to an embodiment of the present invention. Storage device 42 includes a controller 160, MRAM 120, an onboard memory 164, power supply circuitry 166, an onboard communications interface 168 and onboard electrical contacts, indicated at 170. The controller 160 is electrically coupled to the MRAM 120 through MRAM memory bus 172. The controller 160 is electrically coupled to onboard memory 164 through onboard memory bus 174. In addition, controller 160 is electrically coupled to communications interface 168 through communications interface bus 176. Electrical contacts 170 are electrically coupled to communications interface 168 and power supply circuitry 166.

Storage device 42 is electrically coupled to a component of the media distribution system 40 as it is inserted into the selected component, such as programming center 44, video player 46, audio player 48 and computer 50. Onboard electrical contacts 170 of storage device 42 electrically couple with electrical contacts 108 of read/write circuit 90. This electrical coupling is a hard, physical contact between pins, such as male and female connectors.

The storage device 42 communicates with the selected component through onboard communications interface 168 and onboard electrical contacts 170 to electrical contacts 108 and communications interface 100 of read/write circuit 90. The power supply circuitry 166 receives power through the electrical contacts 170 and distributes power throughout storage device 42, to controller 160, MRAM 120, onboard memory 164 and communications interface 168. The power supply circuitry 166 includes capacitors for filtering the power and reducing the effect of noise on storage device 42. In other embodiments, the onboard communications interface 168 is a wireless or contactless interface, such as a RF or an IR interface. In these embodiments, the power supply circuitry 166 is configured as a wireless power supply, utilizing coupling, such as capacitive or inductive coupling to transfer power to the storage device 42.

In the exemplary embodiment, controller 160 is programmed to transfer data to and from MRAM 120. The program for controller 160 is stored in controller 160 and onboard memory 164. The onboard memory 164 includes non-volatile memory, such as ROM, EPROM and EEPROM, and volatile memory, such as RAM. The controller 160 reads operating code from the non-volatile memory and uses the volatile memory for temporary storage and a scratch pad.

The MRAM 120 is the high density, low power magnetic memory previously described in this specification. The MRAM 120 is capable of storing a large quantity of data and in storage device 42, MRAM 120 stores the digital material selected and downloaded through programming center 44. In the exemplary embodiment, the controller 160, MRAM 120, onboard memory 164 and communications interface 168, are separate integrated circuits and devices electrically coupled to a circuit board. In another embodiment, the controller 160, MRAM 120, onboard memory 164 and communications interface 168 are combined into an application specific integrated circuit (ASIC).

The controller 160 is programmed to transfer material from the programming center 44 and store the material in the MRAM 120. For each item of material stored in MRAM 120, the controller 160 stores an item of material identifier in an index that is stored in non-volatile memory of onboard memory 164. Each item of material identifier, referred to as an index entry, includes the title, the address in MRAM 120 where the material is stored and the byte count of the item. The byte count is referred to as a data count of the item stored in MRAM 120. In other embodiments, the data count is the number of 16-bit or 32-bit portions of data, such that the data count is not limited to an 8-bit byte count.

The readers and players 46, 48 and 50 read the index through the controller 160 to produce a list of items stored in the storage device 42. In a reusable storage device 42, the index is updated each time the storage device 42 is programmed with new material. Old index entries are over-written, as is the old material in MRAM 120.

During playback or reading of an item of material from MRAM 120, the controller 160 counts the number of bytes transferred, referred to as a transfer count, for the selected item of material. The controller 160 compares the transfer count and the data count taken from the index entry for the item of material to obtain a compare result. If the compare operation results in the transfer count exceeding the data count, the controller 160 sets a bit in the index entry for the selected item of material to indicate 100 percent or more of the item has been transferred. The storage device 42 regulates subsequent transfer of the selected item in response to the bit being set. The bit indicates a state indicative of the amount of data transferred from the MRAM 120 for the selected item.

In other embodiments, more complicated schemes can be devised to indicate the amount of data transferred from the MRAM 120. In one embodiment, the controller 160 can store a running percentage indicative of the amount of data transferred from the MRAM 120 for a selected item. The controller 160 can be programmed to disable or prevent the transfer of data from the MRAM 120 after a percentage, such as 120 percent or 150 percent of the data for a selected item has been read from the storage device 42. Responding to a higher percentage allows for replaying or rereading certain portions of the selected item of material.

In the exemplary embodiment, the controller 160 sets a bit to indicate the state that 100 percent or more of the data for a selected item has been read from the MRAM 120 and storage device 42. In response to the transfer count exceeding the data count, the controller 160 prevents the selected item of material from being transferred out of MRAM 120 and storage device 42. The controller 160 is configured to disable or prevent the transfer of data non-destructively. By non-destructively disabling the transfer of data, the storage device 42 can be used for reading other items of material and loading new items into the storage device 42.

In one configuration, the controller 160 is programmed to stop transferring data and erase the index entry of the selected item after the transfer count for the item has exceeded the data count. In this case, the index entry is over-written with all ones or all zeros or a checkerboard pattern to erase it. The erased index entry item identifier no longer shows up in any lists on the readers and players 46, 48 and 50. In this situation, the storage device 42 is reusable. The old index entry, which was erased, is over-written when new material is loaded into the storage device 42.

In another configuration, the controller 160 is programmed to stop transferring data and erase some or all of the data for the item of material from MRAM 120 in response to the transfer count exceeding the data count. In this situation, the index entry is also erased to eliminate the title of the material from any listing and to avoid confusion. The MRAM 120 is over-written with ones or zeros or a checkerboard pattern to erase the data from MRAM 120. Erasing the data from MRAM 120 increases the control maintained over distribution of the material. Once the data is erased from MRAM 120, it cannot be easily recovered. The storage device 42 is still reusable such that the index entry and MRAM 120 can be over-written with new data.

In another configuration, the controller 160 is programmed to stop the transfer of data and signal the communications interface 168 to disable input/output circuitry. In this configuration, the controller 160 disables one or more inputs and/or one or more outputs. The storage device 42 is configured to receive some signals from the readers and players 46, 48 and 50, such that the consumer can call up the list of material from the storage device 42 and select a different item to continue. In this configuration, the controller 160 reads the index entry for a selected item and determines if the bit is set. If the bit is not set, the controller 160 proceeds to transfer data from MRAM 120 and out of storage device 42. If the bit is set, the controller 160 transmits an error message to the reader and player 46, 48 and 50.

Each of the above configurations includes non-destructive disabling of the transfer of data from MRAM 120 and storage device 42 to readers and players 46, 48 and 50. In these configurations, the power supply circuit 166 includes enough capacitance to power the storage device 42 while the controller 160 is setting bits and erasing information, which helps to prevent people from removing the device 42 before a bit can be set or an index entry erased.

Figure 7:
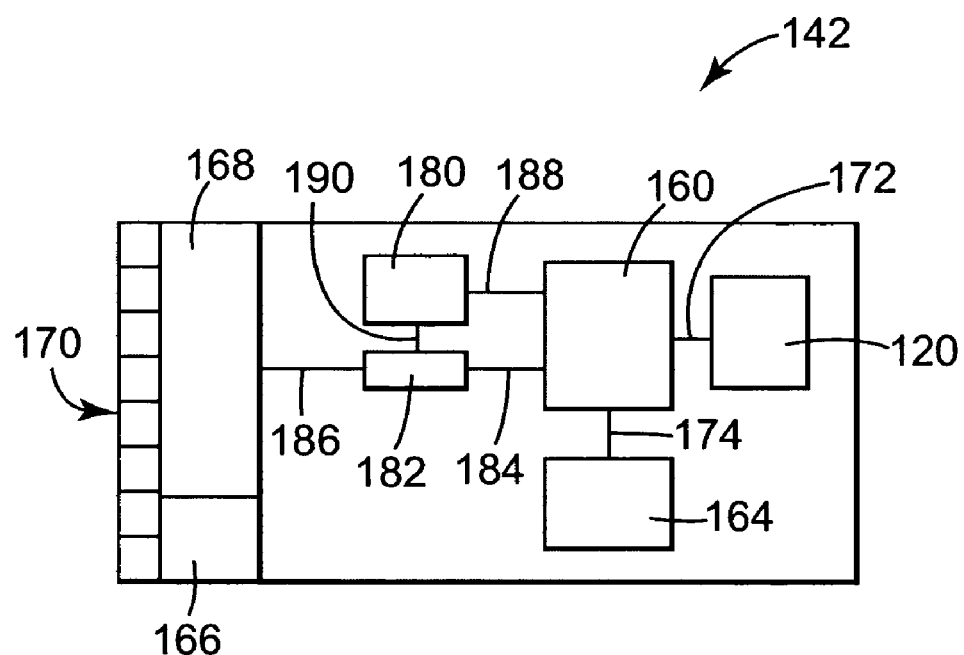
FIG. 7 is a diagram illustrating another exemplary storage device, according to an embodiment of the present invention.

FIG. 7 is a diagram illustrating another exemplary storage device 142, according to an embodiment of the present invention. The storage device 142 includes controller 160, MRAM 120, onboard memory 164, power circuitry 166, onboard communications interface 168 and onboard electrical contacts 170. In addition, storage device 142 includes a fuse programming circuit 180 and a fuse circuit 182. The fuse circuit 182 is electrically coupled between the controller 160 and the communications interface 168, including input/output circuitry. The fuse circuit 182 is electrically coupled to the controller 160 through fuse bus 184. The fuse circuit 182 is electrically coupled to the communications interface 168 through input/output bus 186. The fuse programming circuit 180 is electrically coupled to the controller 160 through programming control line 188, and the fuse programming circuit 180 is electrically coupled to the fuse circuit 182 for programming or burning the fuse circuit 182 through fuse programming line 190. The controller 160 is electrically coupled to MRAM 120 through MRAM bus 172, and to onboard memory 164 through onboard memory bus 174. In another embodiment, the fuse circuit 182 is electrically coupled between the MRAM 120 and controller 160. In this configuration, the MRAM bus 172 is split into two parts and the fuse circuit 182 is inserted between and electrically coupled to the two parts.

In this exemplary embodiment, the controller 160 maintains the index of items of material stored in MRAM 120. As described above, the index is stored in non-volatile memory in the onboard memory 164. Each index entry includes the data count of the item stored in MRAM 120. The controller 160 keeps a transfer count corresponding to the number of bytes of data transferred out of the storage device 42 for a selected item. The controller 160 compares the transfer count for a selected item to the data count of that item to obtain a compare result. The controller 160 disables transfer of data in response to the transfer count exceeding the data count.

In the exemplary embodiment, the storage device 142 destructively disables transfer of data from MRAM 120 and storage device 142. The controller 160 is programmed to signal the fuse programming circuit 180 to program, i.e. burn, one or more fuses in the fuse circuit 182. The fuse circuit 182 is a bus circuit including at least one fuse in series with bus lines, which lead from controller 160 to communications interface 168. In the exemplary embodiment, one or more bus lines have a fuse in series and the fuse programming circuit 180 burns the fuses open to disable the transfer of data from MRAM 120 and storage device 142 to readers and players 46, 48 and 50. Burning the fuses destructively disables the transfer of data. The storage device 142 cannot be reused, short of replacing the fuse circuit 182. Destructively disabling the storage device 142 raises the level of control maintained over downloaded material. To raise the level further, the controller 160 is programmed to erase index entries and the MRAM 120. In the exemplary embodiment, the fuse circuit 182 can be replaced and the storage device 142 can be reused. However, with the index entries and MRAM 120 erased, a high level of control is maintained over the distribution of material downloaded to the storage device 42.

In another embodiment, the fuse circuit 182 is electrically coupled between the controller 160 and MRAM 120. The MRAM bus 172 is divided into two parts and the fuse circuit 182 is electrically coupled between the two parts. In this embodiment, the transfer of data is destructively disabled between MRAM 120 and controller 160. To erase MRAM 120, the controller 160 burns the fuse circuitry 182 after MRAM 120 is erased. Index entries are erased at will.

The storage devices 42 and 142 are compact, card-shaped units including high density, low power MRAM 120. The small size of the storage devices 42 and 142 makes them easy to carry. In addition, the reduced power consumption of the readers and players 46, 48 and 50 make the storage devices 42 and 142 suitable for portable applications. The storage devices 42 and 142 maintain control over the distribution of downloaded material by disabling and preventing the transfer of the same data twice from MRAM 120. Also, the electronic transfer of data is less cumbersome and burdensome on the consumer as compared to renting CD's and DVD's.

What is claimed is:

1. A storage device, comprising:
a magnetic memory; and
a control circuit configured to transfer selected data from the magnetic memory a selected number of times and to regulate the transfer of the selected data from the magnetic memory subsequent to transferring the selected data from the magnetic memory the selected number of times, wherein the control circuit is configured to stop the transfer of the selected data subsequent to transferring the selected data from the magnetic memory the selected number of times.

2. The storage device of claim 1, wherein the selected number of times that the control circuit is configured to transfer the selected data is once.

3. The storage device of claim 1, wherein the selected number of times that the control circuit is configured to transfer the selected data is a fraction greater than one.

4. The storage device of claim 1, wherein the control circuit is configured to erase at least some of the selected data from the magnetic memory to regulate the transfer of the selected data from the magnetic memory.

5. The storage device of claim 1, wherein the control circuit is configured to erase an index entry for the selected data to regulate the transfer of the selected data from the magnetic memory.

6. The storage device of claim 1, wherein the control circuit is configured to disable an input/output circuit to regulate the transfer of the selected data from the magnetic memory.

7. The storage device of claim 1, wherein the control circuit comprises a fuse configured to be programmed to regulate the transfer of the selected data from the magnetic memory.

8. The storage device of claim 1, wherein the control circuit comprises a controller programmed to transfer the selected data from the magnetic memory the selected number of times and to regulate the transfer of the selected data from the magnetic memory subsequent to transferring the selected data from the magnetic memory the selected number of times.

9. The storage device of claim 1, wherein the control circuit is configured to store a data count of the selected data.

10. The storage device of claim 9, wherein the control circuit is configured to obtain a transfer count of the selected data transferred from the magnetic memory, to compare the transfer count to the data count of the selected data to obtain a compare result and to regulate the transfer of the selected data from the magnetic memory in response to the compare result.

11. The storage device of claim 1, wherein the control circuit is configured to program a state into non-volatile memory indicative of an amount of the selected data transferred from the magnetic memory.

12. The storage device of claim 11, wherein the control circuit is configured to read the state from the non-volatile memory and to regulate the transfer of the selected data from the magnetic memory based on the state read from the non-volatile memory.

13. The storage device of claim 11, comprising input/output circuitry electrically coupled to the control circuit, wherein the control circuit is configured to read the state from the non-volatile memory and to disable the input/output circuitry based on the state read from the non-volatile memory.

14. A storage device, comprising:
a magnetic memory; and
a controller electrically coupled to the magnetic memory, wherein the controller is configured to read data from the magnetic memory during a first transfer of the data from the magnetic memory and to prevent reading of the data from the magnetic memory after the first transfer of the data from the magnetic memory.

15. The storage device of claim 14, wherein the controller is configured to erase at least some of the data from the magnetic memory to prevent reading of the data from the magnetic memory after the first transfer of the data from the magnetic memory.

16. The storage device of claim 14, wherein the controller is configured to store a data count of the data, to obtain a transfer count of the data as the data is transferred from the magnetic memory in the first transfer and to erase at least some of the data from the magnetic memory in response to the transfer count exceeding the data count after the first transfer of the data from the magnetic memory.

17. The storage device of claim 14, comprising:
a fuse connected to the controller; and
a programming circuit electrically coupled to the fuse and the controller, wherein the controller is configured to signal the programming circuit to cause the fuse to disable reading of the data from the magnetic memory after the first transfer of the data from the magnetic memory.

18. The storage device of claim 14, comprising:
a fuse electrically coupled to the controller and the magnetic memory; and
a programming circuit electrically coupled to the fuse and the controller, wherein the controller is configured to signal the programming circuit to cause the fuse to disable reading of the data from the magnetic memory after the first transfer of the data from the magnetic memory.

19. The storage device of claim 14, comprising:
an input/output circuit;
a fuse electrically coupled to the controller and the input/output circuit; and
a programming circuit electrically coupled to the fuse and the controller, wherein the controller is configured to signal the programming circuit to cause the fuse to disable reading of the data from the magnetic memory after the first transfer of the data from the magnetic memory.

20. The storage device of claim 14, wherein the controller programs a state into non-volatile memory to indicate an amount of the data has been transferred from the magnetic memory during the first transfer of the data from the magnetic memory.

21. The storage device of claim 20, wherein the controller is configured to read the state from the non-volatile memory and to prevent reading of the data from the magnetic memory based on the state read from the non-volatile memory.

22. The storage device of claim 20, comprising input/output circuitry electrically coupled to the controller, wherein the controller is configured to read the state from the non-volatile memory and to prevent reading of the data by disabling the input/output circuitry based on the state read from the non-volatile memory.

23. A method of controlling material distribution from a magnetic memory, comprising:
transferring selected data from the magnetic memory a selected number of times;
regulating the transfer of the selected data from the magnetic memory subsequent to transferring the selected data from the magnetic memory the selected number of times; and
stopping the transfer of the selected data subsequent to transferring the selected data from the magnetic memory the selected number of times.

24. A method of controlling material distribution from a magnetic memory, comprising:
transferring selected data from the magnetic memory a selected number of times; and
regulating the transfer of the selected data from the magnetic memory subsequent to transferring the selected data from the magnetic memory the selected number of times,
wherein regulating the transfer comprises one from a group comprising:
erasing some of the selected data from the magnetic memory;
erasing an index entry corresponding to the selected data;
disabling an input/output circuit during attempts to transfer the selected data; and
programming a fuse to disable the transfer of the selected data from the magnetic memory.

25. A method of controlling material distribution from a magnetic memory, comprising:
transferring selected data from the magnetic memory a selected number of times; and regulating the transfer of the selected data from the magnetic memory subsequent to transferring the selected data from the magnetic memory the selected number of times,
wherein regulating the transfer comprises:
storing a data count of the selected data;
obtaining a transfer count of the selected data transferred from the magnetic memory;
comparing the transfer count and the data count to obtain a compare result; and
regulating the transfer of the selected data from the magnetic memory based on the compare result.

26. A method of controlling material distribution from a magnetic memory, comprising:
transferring selected data from the magnetic memory a selected number of times;
regulating the transfer of the selected data from the magnetic memory subsequent to transferring the selected data from the magnetic memory the selected number of times; and
programming a state into non-volatile memory to indicate an amount of the selected data transferred from the magnetic memory.

27. The method of claim 26, wherein regulating the transfer comprises:
reading the state from the non-volatile memory; and
regulating the transfer of the data from the magnetic memory based on the state read from the non-volatile memory.

28. The method of claim 26, wherein regulating the transfer comprises:
reading the state from the non-volatile memory; and
disabling input/output circuitry based on the state read from the non-volatile memory.

* * * * *

UNITED STATES PATENT AND TRADEMARK OFFICE
CERTIFICATE OF CORRECTION

| | |
|---|---|
| PATENT NO. | : 7,038,941 B2 |
| APPLICATION NO. | : 10/741581 |
| DATED | : May 2, 2006 |
| INVENTOR(S) | : Sarah Morris Brandenberger et al. |

It is certified that error appears in the above-identified patent and that said Letters Patent is hereby corrected as shown below:

On the title page, item (75), in "Inventors", in column 1, line 3, delete "London (GB)" and insert -- Vancouver (CA) --, therefor.

Signed and Sealed this

Twenty-third Day of June, 2009

JOHN DOLL
*Acting Director of the United States Patent and Trademark Office*